US012047102B2

(12) United States Patent
Cao

(10) Patent No.: US 12,047,102 B2
(45) Date of Patent: Jul. 23, 2024

(54) APPARATUS AND METHOD FOR ADJUSTING LEVEL OF LOW-NOISE AMPLIFIER (LNA), AND TERMINAL DEVICE

(71) Applicant: SPREADTRUM COMMUNICATIONS (SHANGHAI) CO., LTD., Shanghai (CN)

(72) Inventor: Mingwei Cao, Shanghai (CN)

(73) Assignee: SPREADTRUM COMMUNICATIONS (SHANGHAI) CO., LTD., Shanghai (CN)

( * ) Notice: Subject to any disclaimer, the term of this patent is extended or adjusted under 35 U.S.C. 154(b) by 97 days.

(21) Appl. No.: 17/747,263

(22) Filed: May 18, 2022

(65) Prior Publication Data

US 2022/0278704 A1 Sep. 1, 2022

Related U.S. Application Data

(63) Continuation of application No. PCT/CN2020/111778, filed on Aug. 27, 2020.

(30) Foreign Application Priority Data

Nov. 18, 2019 (CN) .......................... 201911128762.9

(51) Int. Cl.
*H04L 25/08* (2006.01)
*H03F 3/189* (2006.01)
(Continued)

(52) U.S. Cl.
CPC ........... *H04B 1/1027* (2013.01); *H03F 3/189* (2013.01); *H03G 3/3036* (2013.01); *H03M 1/18* (2013.01); *H03F 2200/294* (2013.01)

(58) Field of Classification Search
CPC .......... H04B 7/0413; H04B 2001/0408; H04B 17/318; H04B 1/0007; H03G 3/3052;
(Continued)

(56) References Cited

U.S. PATENT DOCUMENTS 9,264,280 B1 * 2/2016 Waheed ................... H04L 27/22
10,742,185 B1 * 8/2020 Li ............................ H03M 1/12
(Continued)

FOREIGN PATENT DOCUMENTS

CN 101026687 A 8/2007
CN 101171746 A 4/2008
(Continued)

OTHER PUBLICATIONS

Chen, Wencheng et al. "Performance of OFDM with AGC at 340 Mz", Proceedings of 2011 IEEE Pacific Rim Conference on Communications, Computers and Signal Processing, dated Oct. 3, 2011.

*Primary Examiner* — Khai Tran
(74) *Attorney, Agent, or Firm* — HAUPTMAN HAM, LLP

(57) ABSTRACT

This disclosure relates to an apparatus and a method for adjusting a level of a low-noise amplifier (LNA), a terminal device, and a network-element device. The apparatus includes a LNA, a peak-to-average power ratio (PAPR) module, and an automatic gain control (AGC). The LNA is configured to amplify a received signal to obtain a first signal, where the received signal includes out-of-band interference and a target signal. The PAPR module is configured to measure a PAPR value of the first signal. The AGC module is configured to adjust a gain level of the LNA, according to the PAPR value, a maximum-linear-input-power point of the LNA, and a strength of the first signal.

17 Claims, 5 Drawing Sheets

(51) Int. Cl.
*H03G 3/30* (2006.01)
*H03M 1/18* (2006.01)
*H04B 1/10* (2006.01)

(58) Field of Classification Search
CPC ............... H03G 3/3042; H03G 3/3036; H03F 2200/294; H03F 3/189; H03F 2200/451; H03F 2200/336; H04L 27/2647; H04L 27/22; H04W 52/245; H04W 52/52; H03M 1/18
USPC ........................................................ 375/346
See application file for complete search history.

(56) References Cited

U.S. PATENT DOCUMENTS

| | | | |
|---|---|---|---|
| 11,152,966 B1* | 10/2021 | Oyman | ................. H04J 11/004 |
| 2007/0258549 A1 | 11/2007 | Cheng et al. | |
| 2008/0225168 A1 | 9/2008 | Ouslis et al. | |
| 2010/0184397 A1* | 7/2010 | Kadous | ................. H03G 3/3078 |
| | | | 455/234.1 |
| 2010/0321219 A1* | 12/2010 | Li | .......................... H03M 1/185 |
| | | | 341/139 |
| 2011/0026651 A1 | 2/2011 | Bhukania et al. | |
| 2017/0078133 A1* | 3/2017 | Terry | ..................... H04J 11/003 |
| 2019/0207738 A1* | 7/2019 | Son | ........................... H04L 5/14 |
| 2021/0022090 A1* | 1/2021 | Hassan | ................. H04W 52/36 |

FOREIGN PATENT DOCUMENTS

| | | |
|---|---|---|
| CN | 102405595 A | 4/2012 |
| CN | 104137428 A | 11/2014 |
| CN | 204465876 U | 7/2015 |
| CN | 107211379 A | 9/2017 |
| CN | 107565998 A | 1/2018 |
| CN | 208028859 U | 10/2018 |
| CN | 108781120 A | 11/2018 |
| CN | 108900171 A | 11/2018 |
| CN | 110445562 A | 11/2019 |

* cited by examiner

APPARATUS AND METHOD FOR ADJUSTING LEVEL OF LOW-NOISE AMPLIFIER (LNA), AND TERMINAL DEVICE

CROSS-REFERENCE TO RELATED APPLICATION(S)

This application is a continuation application of International Application No. PCT/CN2020/111778, filed on Aug. 27, 2020, which claims priority to Chinese Patent Application No. 201911128762.9, filed on Nov. 18, 2019, the entire disclosure of which are incorporated herein by reference.

TECHNICAL FIELD

This disclosure relates to the field of communication technology, and in particular to an apparatus and a method for adjusting a level of a low-noise amplifier (LNA), and a terminal device.

BACKGROUND

In a burst communication system, there are various interference. When detecting a target signal, a receiver needs to adjust a gain of a low-noise amplifier (LNA). In related art, an automatic gain control (AGC) module adjusts a gain level of the LNA according to a peak-to-average power ratio (PAPR) of the target signal. However, since the interference and the target signal have different frequencies, this level-adjusting mode will cause the LNA to have a too high level, which results in nonlinear distortion and seriously affects receiving performance; or this level-adjusting mode will cause the LNA to have a too low level, which results in a larger noise figure (NF) and sacrifices a signal-to-noise ratio (SNR).

SUMMARY

According to an aspect of the present disclosure, an apparatus for adjusting a level of a LNA is provided. The apparatus for adjusting the level of the LNA includes the LNA, a peak-to-average power ratio (PAPR) module, and an automatic gain control (AGC). The LNA is configured to amplify a received signal to obtain a first signal, where the received signal includes out-of-band interference and a target signal. The PAPR module is configured to measure a PAPR value of the first signal and a strength of the first signal. The AGC module is configured to adjust a gain level of the LNA, according to the PAPR value, a maximum-linear-input-power point of the LNA, and the strength of the first signal.

According to another aspect of the present disclosure, a method for adjusting a level of a LNA is provided. The method is applicable to an apparatus for adjusting the level of the LNA and includes: amplifying a received signal to obtain a first signal, where the received signal includes out-of-band interference and a target signal; measuring a PAPR value of the first signal and a strength of the first signal; and adjusting a gain level of the LNA, according to the PAPR value, a maximum-linear-input-power point of the LNA, and the strength of the first signal.

According to another aspect of the disclosure, a terminal device is provided. The terminal device includes a processor and a memory. The memory is configured to store instructions executable by the processor. The processor is configured to implement the method described above.

BRIEF DESCRIPTION OF THE DRAWINGS

The accompanying drawings that are included in and constitute a part of the description, together with the description, illustrate exemplary implementations, features, and aspects of the present disclosure, and are intended for explaining the principles of the present disclosure.

DETAILED DESCRIPTION

Figure 1:
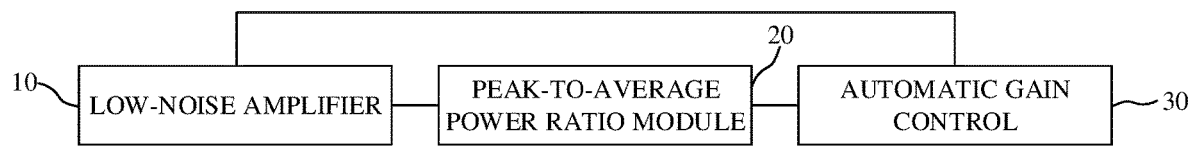
FIG. 1 is a structural diagram of an apparatus for adjusting a level of a low-noise amplifier (LNA) according to an implementation of the present disclosure.

Various exemplary implementations, features, and aspects of the present disclosure will be described in detail below with reference to the accompanying drawings. The same reference numerals in the drawings represent elements with the same or similar functions. Although various aspects of the implementations are illustrated in the drawings, it is not necessary to draw the drawings to scale unless specifically noted.

The term "exemplary" herein means "as an example, implementation, or illustrative". Any implementation described herein as "exemplary" need not be interpreted as superior to or better than other implementations.

In addition, in order to better illustrate the present disclosure, many specific details are given in the following specific implementations. Those skilled in the art should understand that the present disclosure can still be implemented without some specific details. In some examples, methods, means, elements, and circuits well-known to those skilled in the art are not described in detail in order to highlight the subject matter of the present disclosure.

In a burst communication system, such as Bluetooth, wireless fidelity (WiFi) (802.11a/b/g/n/ac/ax), cellular communication systems, etc., there will be various interferences, and a receiver needs to detect signals when there is interference, which requires that a signal head can be detected first and an analog gain of the receiver can be adjusted to an appropriate level by an automatic gain control (AGC) module. The above communication systems usually have multiple available frequency bands, therefore, a frequency range of a low-noise-amplifier (LNA) at the front end of the receiver is generally wideband, that is, multiple target frequency bands will be included. For example, in a WiFi receiving apparatus, there are usually two LNAs, one is responsible for a frequency band of 2 gigahertz (GHz), and the other is responsible for a frequency band of 5 GHz. In this way, when the receiver receives a certain bandwidth of 20 mega (M), a LNA will also amplify signals of other frequencies. Generally, in order to ensure performance of large signals and small signals, the LNA has multiple levels. Large gain levels are used for the small signals, and noise figures (NFs, which are input SNRs/output SNRs) are very small, which can ensure SNRs; while small gain levels (which may be negative) are used for the large signals to ensure that nonlinear distortion will not occur, but NFs will be very large and SNRs will be deteriorated.

In the related art, when there is no interference, a level is easily to be adjusted by an AGC module, and a LNA and a variable gain amplifier (VGA) can be adjusted to just right levels respectively according to characteristics of a target signal, such as a peak-to-average power ratio (PAPR, whose statistical characteristics are known). However, when there is interference, especially out-of-band interference, a frequency of the interference is different from a frequency of a signal, and if a scheme of adjusting the LNA and the VGA to just right levels respectively according to the PAPR of the target signal is still adopted, performance is not the best. Because if the interference is large, an energy of the interference is dominant and an energy of the target signal is relatively small at the input of the LNA, therefore, the PAPR depends on the interference. In this case, the PAPR of the interference is much greater than the PAPR of the target signal, which may cause the level of the LNA to be too high, resulting in nonlinear distortion of the LNA and seriously affecting performance. On the contrary, if the PAPR of the interference is far less than the PAPR of the target signal, the level of the LNA will be adjusted to be too low, thus a NF will become larger and a SNR will be sacrificed.

For example, in a WiFi system, when the receiver receives an 802.11n signal but is interfered by a strong out-of-band 802.11b signal, and a PAPR of the 802.11n signal is much greater than a PAPR of the 802.11b signal, it is obviously inappropriate to adjust the LNA according to the PAPR of the 802.11n signal, in this case, a relatively lower level of the LNA will be selected and the NF will become larger. On the contrary, when the receiver receives an 802.11b signal but is interfered by a strong out-of-band 802.11n signal, a relatively higher level of the LNA will be selected, which results in serious nonlinear distortion and serious damages to performance.

Considering that in the burst communication system, the receiver needs to catch and lock a signal in a certain period and adjust an appropriate level. Since the receiver is easily interfered by strong out-of-band interference during communication, although out-of-band interference will be suppressed by an analog frequency-selective filter, the LNA is all-pass. It can be seen that the LNA has the greatest influence on the NF, that is, has the greatest influence on the SNR. Therefore, when the level of the LNA is adjusted, a higher accuracy is needed, that is, nonlinearity cannot be caused, nor can a too low level and a too large NF. However, for the above burst communication system, each user has competitive access and transmission time is not fixed, therefore, interference is easy to form. In addition, a PAPR of a Bluetooth protocol signal is different from a PAPR of a WiFi protocol (802.11a/b/g/n/ac/ax) signal, and PAPRs of other environmental interference are more unmeasurable. Therefore, it is very beneficial to measure a total PAPR of interference+signal, such that the LNA can be adjusted more intelligently, thus having better performance.

Therefore, an intelligent level-adjusting scheme of a LNA in a burst broadband communication system is provided in implementations of the present disclosure. By measuring a total average power and a PAPR value of both a target signal and interference of a received signal, and adjusting a level in combination with a maximum-linear-input-power point of a LNA, a total power peak value of the received signal is just less than and closest to the maximum-linear-input-power point when the received signal enters the LNA, such that a SNR is optimized, and the intelligent level adjustment of the LNA under out-of-band interference is realized.

Reference can be made to FIG. 1, which is a structural diagram of an apparatus for adjusting a level of a LNA according to an implementation of the present disclosure. The apparatus can include a LNA 10, a PAPR module 20, and an AGC module 30. The LNA 10 is configured to amplify a received signal to obtain a first signal, where the received signal includes out-of-band interference and a target signal. The PAPR module 20 is configured to measure a PAPR value of the first signal. The AGC module 30 is configured to adjust a gain level of the LNA, according to the PAPR value, a maximum-linear-input-power point of the LNA, and a strength of the first signal.

The received signal is a signal received by the LNA through an antenna and transmitted by a transmitting end. In the burst communication system, the received signal includes the target signal and the out-of-band interference. The out-of-band interference is interference caused by harmonic of a transmitter or stray radiation in passbands of receiving useful signals. A main task of the LNA is to amplify a signal under the premise of generating as low noise as possible to reduce an influence of noise generated by a next-stage module on the signal. The above received signal enters the LNA and then is amplified by the LNA to output a RF signal, namely the first signal.

The above first signal is input to the PAPR module, and when the PAPR module measures the PAPR value of the first signal, the PAPR module can also measure a total average power of the target signal+the out-of-band interference (i.e., the strength of the first signal) and feed a measured result back to the AGC module. The PAPR value of the first signal is a ratio of a peak power of the first signal to an average power of the first signal, and the PAPR value can be calculated according to a measured average power and a measured peak power of the first signal.

The AGC module is configured to receive the PAPR value of the first signal and the strength of the first signal which are reported by the PAPR module, and take the PAPR value and the maximum-linear-input-power point of the LNA as known information to adjust a level according to the strength of the first signal, that is, the total average power of the target signal+the out-of-band interference, so as to realize optimal level adjustment, such that the total peak power of the target signal+the out-of-band interference is just less than and closest to the maximum-linear-input-power point of the LNA when entering the LNA, thereby resulting in an optimal SNR.

It should be noted that the PAPR module is a module in a random form and can measure a PAPR value and a strength of a signal. For example, the PAPR module may be a hardware module (e.g., an analog circuit, or a digital circuit), a software module (e.g., the PAPR module can be implemented by executing logic instructions to realize corresponding functions through a processing device such as a single chip microcomputer, a microprocessor, a field programmable logic device, etc.), or a processing module composed of hardware and software, which is not limited by the present disclosure. Similarly, the AGC module is a module in a random form and can adjust a gain level of the LNA which amplifies the received signal. For example, the AGC module may be a hardware module (e.g., an analog circuit, or a digital circuit), a software module (e.g., the AGC module can be implemented by executing logic instructions to realize corresponding functions through a processing device such as a single chip microcomputer, a microprocessor, a field programmable logic device, etc.), or a processing module composed of hardware and software, which is not limited by the present disclosure. In this case, the apparatus for adjusting the level of the LNA can be arranged at any appropriate position in a receiver of a terminal device and/or a network-element device, which is not limited by the present disclosure.

In a possible implementation, the apparatus further includes a first analog-to-digital converter (ADC). The first ADC is configured to perform analog-to-digital conversion on the first signal output by the LNA and input a converted first digital signal to the PAPR module.

Figure 2:
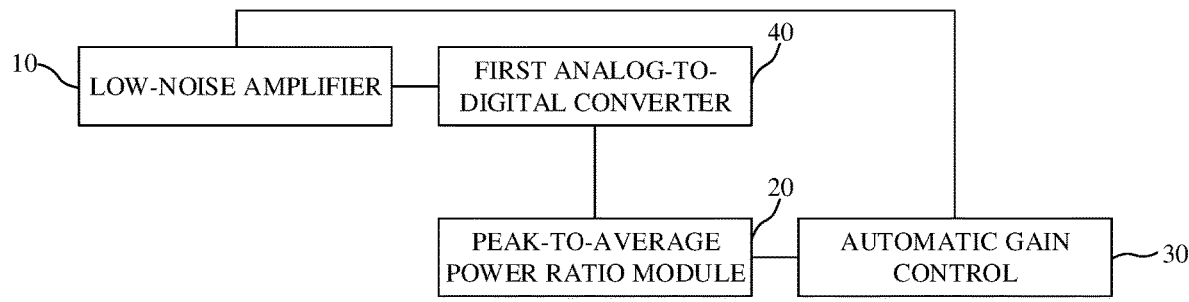
FIG. 2 is a structural diagram of an apparatus for adjusting a level of a LNA according to an implementation of the present disclosure.

Exemplarily, reference can be made to FIG. 2, which is a structural diagram of an apparatus for adjusting a level of a LNA according to an implementation of the present disclosure. A first ADC 40 is coupled with an AGC module 10 and a PAPR module 20, and is configured to convert the first signal into a first digital signal through analog-to-digital conversion. It should be noted that the first ADC module 40 is not used for demodulation, but only used for performing analog-to-digital conversion on an output signal of the LNA, therefore, in order to reduce costs and save power consumption, the first ADC module 40 may be an ADC module with low precision.

In a possible implementation, the apparatus further includes a frequency mixer, a frequency-selective filter, a VGA, a second ADC. The frequency mixer is configured to perform frequency mixing on the first signal and a local oscillator signal to obtain a baseband signal. The frequency-selective filter is configured to suppress out-of-band interference in the baseband signal. The VGA is configured to amplify a baseband signal in which the out-of-band interference is suppressed, to obtain a second signal. The second ADC is configured to perform analog-to-digital conversion on the second signal and input a converted second digital signal to the AGC module.

Figure 3:
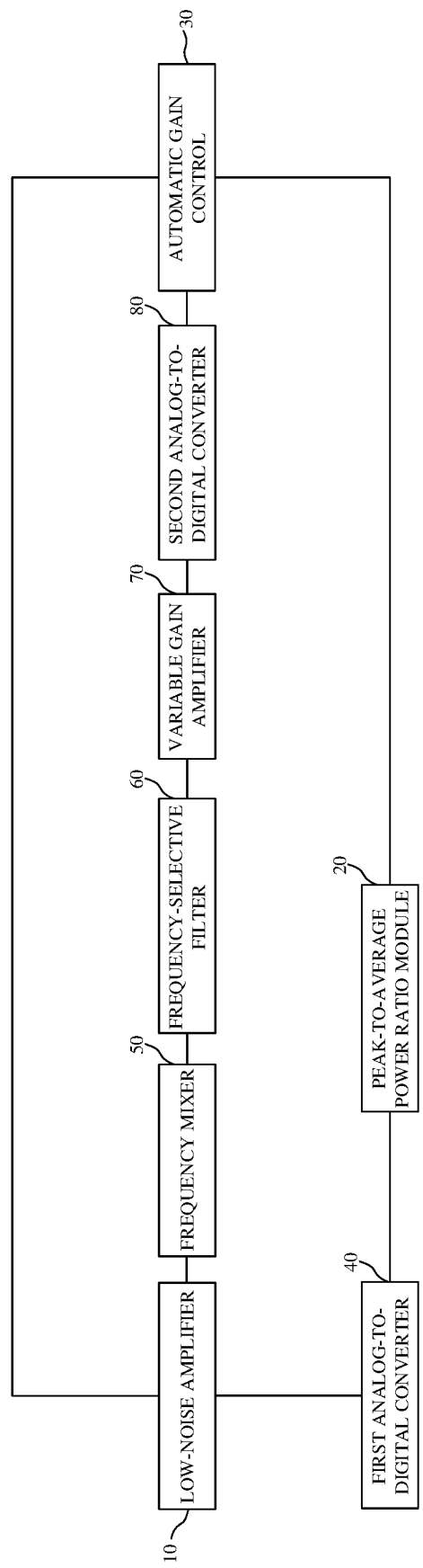
FIG. 3 is a structural diagram of an apparatus for adjusting a level of a LNA according to an implementation of the present disclosure.

Exemplarily, reference can be made to FIG. 3, which is a structural diagram of an apparatus for adjusting a level of a LNA according to an implementation of the present disclosure. The target signal and the out-of-band interference enter the LNA 10 through an antenna for first-stage amplification, the LNA 10 is configured to amplify the received signal to be the first signal according to a gain level, and the first signal is converted by the first ADC 40 and then input to the PAPR module 20. In this case, the first signal also enters a frequency mixer 50 coupled with the LNA 10, and the frequency mixer 50 is configured to perform frequency spectrum shifting on the first signal, that is, mix the first signal with a local oscillator signal to obtain a baseband signal. The baseband signal enters a frequency-selective filter 60, the out-of-band interference is suppressed by the frequency-selective filter 60, a processed signal enters a VGA 70, and the VGA 70 is configured to perform second-stage amplification on the processed signal through gain adjustment to obtain a second signal. The second signal is input to a second ADC 80, analog-to-digital conversion is performed on the second signal to obtain a second digital signal, and the second digital signal is input to the AGC module 30 to obtain a target signal with a high SNR.

In a possible implementation, the AGC module is specifically configured to obtain a maximum power value of the received signal according to the strength of the first signal and the PAPR value; select the maximum-linear-input-power point of the LNA according to the maximum power value; and determine a corresponding gain level of the LNA according to the maximum-linear-input-power point.

Exemplarily, in a process of adjusting a gain level of the LNA, the AGC module first adds the PAPR value measured by the PAPR module and the strength of the first signal (the total average power of the target signal and the out-of-band interference) to obtain the maximum power value of the received signal. Then, based on the maximum power value, the gain level of the LNA is adjusted to achieve an optimal level adjustment and a minimum NF. In this way, the level of the LNA is adjusted according to the total average power of the target signal+the out-of-band interference, instead of directly according to the PAPR of the target signal in the related art, such that a SNR can be optimized.

In a possible implementation, the LNA includes multiple maximum-linear-input-power points. The AGC module is further configured to select a maximum-linear-input-power point with a minimum value, in a case that the maximum power value is not greater than the multiple maximum-linear-input-power points.

Each maximum linear-input-power point is provided with a corresponding amplification gain level. Exemplarily, gain levels are negatively correlated with maximum-linear-input-power points, that is, when a gain level is higher, a maximum-linear-input-power point is smaller. The number of gain levels of the LNA, that is, the number of maximum-linear-input-power points, can be set according to actual environment and the LNA's own parameters. For example, the maximum-linear-input-power points of the LNA may include: −50 dbm, −40 dbm, −30 dbm, −20 dbm, and −10 dbm, and corresponding gain levels are 40 db, 30 db, 20 db, 10 db, and 0 db, respectively, that is, −50 dbm @40 db gain level, −40 dbm @30 db gain level, −30 dbm @20 db gain level, −20 dbm @10 db gain level, −10 dbm @0 db gain level.

When obtaining the maximum power value of the received signal, the AGC module compares the maximum power value of the received signal with each preset maximum-linear-input-power point, selects maximum-linear-input-power points to be selected which are greater than the maximum power value, and further selects one maximum-linear-input-power point with a minimum value as the maximum-linear-input-power point among the maximum-linear-input-power points to be selected. For example, If the total average power of the target signal and the out-of-band interference is −80 dbm and the PAPR value is 10 db, the maximum power value obtained by adding is (−80+10) dbm=−70 dbm. Since −70 dbm is less than any of known maximum-linear-input-power points, the minimum value, that is, −50 dbm is selected among the maximum-linear-input-power points to be selected (i.e., −50 dbm, −40 dbm, −30 dbm, −20 dbm, −10 dbm), so as to determine that 40 db gain level corresponding to −50 dbm is a gain level needed to be adjusted to for the LNA. Similarly, if the total average power of the target signal and the out-of-band interference is −50 dbm and the PAPR value is 10 db, the maximum power value obtained by adding is (−50+10)dbm=−40 dbm. Based on the above level-selection mode, since −40 dbm<=−40 dbm, 30 db gain level can be selected for the LNA. Similarly, if the total average power of the target signal and the out-of-band interference is −20 dbm and PAPR value is 10 db, the maximum power is (−20+10) dbm=−10 dbm<=−10 dbm, such that 0 db gain level can be selected for the LNA.

In a possible implementation, the AGC module is further configured to compare the out-of-band interference with the target signal to obtain a determination result; and modify the PAPR value according to the determination result.

In an actual operation process, considering that PAPR values measured by the PAPR module in each period are changeable, a measured PAPR value may be less than a maximum PAPR value in the whole receiving period, therefore, the measured PAPR value can be further modified according to a magnitude of the out-of-band interference and a magnitude of the target signal, thereby further improving receiving performance.

In a possible implementation, the AGC module is further configured to compare the out-of-band interference with the target signal according to a LNA output power and a VGA output power; obtain a determination result that the out-of-band interference is greater than the target signal, in a case that a difference between the LNA output power and the VGA output power is greater than a preset threshold; and obtain a determination result that the out-of-band interference is less than the target signal, in a case that a difference between the LNA output power and the VGA output power is not greater than the preset threshold.

The LNA output power is the strength of the first signal, and represents a magnitude of the total average power of the target signal and the out-of-band interference. The VGA output power is a strength of the second signal (a signal in which the out-of-band interference is suppressed), and represents a magnitude of the power of the target signal. Therefore, the magnitude of the target signal and the magnitude of the out-of-band interference can be compared through a difference between the LNA output power and the VGA output power. When the difference between the LNA output power and the VGA output power is greater, the interference is stronger. When the difference between the LNA output power and the VGA output power is small, the interference is small. Furthermore, when the LNA output power and the VGA output power are subtracted from each other, a difference result can represent a magnitude of the out-of-band interference. The magnitude of the out-of-band interference and the magnitude of the target signal can be determined by comparing the difference with a preset threshold or the VGA output power. The preset threshold can be set according to actual requirements, which is not limited by the present disclosure.

In a possible implementation, the AGC module is further configured to obtain the PAPR value according to a statistic of the PAPR value, in a case that the out-of-band interference is less than the target signal; and add the measured PAPR value to a preset increment to obtain the PAPR value, in a case that the out-of-band interference is greater than the target signal.

In this way, based on the above determination result of the magnitude of the target signal and the magnitude of the out-of-band interference, a known statistic can be used as the PAPR value when there is only the target signal or when the out-of-band interference is smaller than the target signal. In this case, the PAPR module can be controlled to stop measurement operation, thereby saving power consumption. Also, when the out-of-band interference is stronger than the target signal, the measured PAPR value plus a smaller increment (e.g., 1 db) can be used as a final PAPR value to ensure receiving of the target signal.

For example, if the total average power of the target signal and the out-of-band interference is −50 dbm, the out-of-band interference is stronger than the target signal, and the PAPR value is 10 db, the PAPR value is modified by (10+1)db=11 db, the maximum power value obtained by summing is (−50+11)dbm=−39 dbm. Based on the above gain-level-selection mode, since −39 dbm<−30 dbm, 20 db gain level can be selected for the LNA, thereby ensuring receiving of the target signal.

It should be noted that although the above implementations are taken as examples to introduce the apparatus for adjusting the level of the LNA as above, those skilled in the art can understand that the present disclosure should not be limited thereto. In fact, a user can flexibly set each implementation according to personal preferences and/or actual application scenario, as long as each implementation conforms to the technical solutions of the present disclosure.

As such, in the implementations of the present disclosure, by measuring a total average power and a PAPR value of both a target signal and interference of a received signal, and adjusting a level in combination with a maximum-linear-input-power point of a LNA, a total power peak value of the received signal is just less than and closest to the maximum-linear-input-power point when the received signal enters the LNA, such that a SNR is optimized, and intelligent level adjustment of the LNA in a burst broadband communication system is realized.

Figure 4:
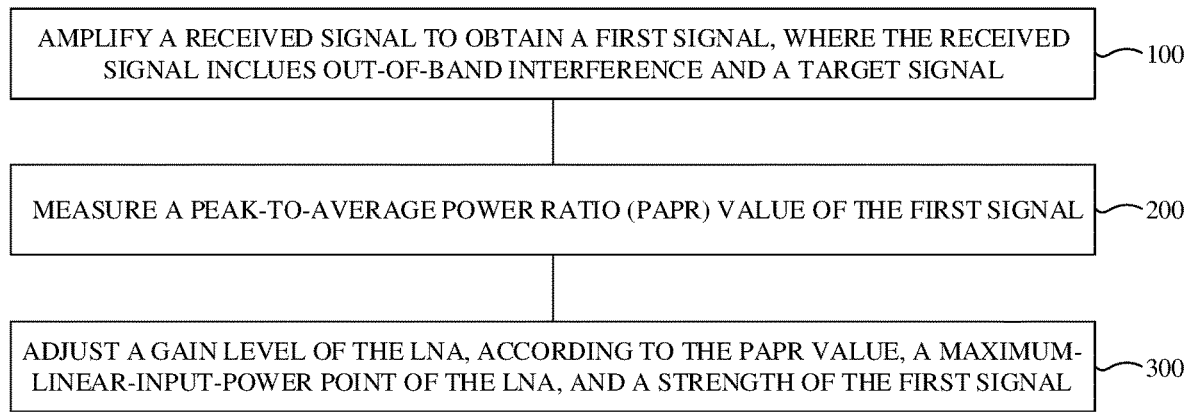
FIG. 4 is a flowchart of a method for adjusting a level of a LNA according to an implementation of the present disclosure.

Reference can be made to FIG. 4, which is a flowchart of a method for adjusting a level of a LNA according to an implementation of the present disclosure. The method is applicable to an apparatus for adjusting a level of a LNA. The method includes following steps: step 100, amplifying a received signal to obtain a first signal, where the received signal includes out-of-band interference and a target signal; step 200, measuring a peak-to-average power ratio (PAPR) value of the first signal; and step 300, adjusting a gain level of the LNA, according to the PAPR value, a maximum-linear-input-power point of the LNA, and a strength of the first signal.

In a possible implementation, adjusting the gain level of the LNA, according to the PAPR value, the maximum-linear-input-power point of the LNA, and the strength of the first signal includes: obtaining a maximum power value of the received signal according to the strength of the first signal and the PAPR value; selecting the maximum-linear-input-power point of the LNA according to the maximum power value; and determining a corresponding gain level of the LNA according to the maximum-linear-input-power point.

In a possible implementation, the LNA includes multiple maximum-linear-input-power points. Selecting the maximum-linear-input-power point of the LNA according to the maximum power value includes: selecting a maximum-linear-input-power point with a minimum value, in a case that the maximum power value is not greater than the multiple maximum-linear-input-power points.

In a possible implementation, the method further includes: performing analog-to-digital conversion on the first signal output by the LNA to obtain a first digital signal.

In a possible implementation, the method further includes: performing frequency mixing on the first signal and a local oscillator signal to obtain a baseband signal; suppressing out-of-band interference in the baseband signal; amplifying a baseband signal in which the out-of-band interference is suppressed, to obtain a second signal; and performing analog-to-digital conversion on the second signal to obtain a second digital signal.

In a possible implementation, the method further includes: comparing the out-of-band interference with the target signal to obtain a determination result; and modifying the PAPR value according to the determination result.

In a possible implementation, modifying the PAPR value according to the determination result includes: obtaining the PAPR value according to a statistic of the PAPR value, in a case that the out-of-band interference is less than the target signal; and adding the measured PAPR value to a preset increment to obtain the PAPR value, in a case that the out-of-band interference is greater than the target signal.

In a possible implementation, comparing the out-of-band interference with the target signal to obtain the determination result includes: comparing the out-of-band interference with the target signal according to a LNA output power and a variable gain amplifier (VGA) output power; obtaining a determination result that the out-of-band interference is greater than the target signal, in a case that a difference between the LNA output power and the VGA output power is greater than a preset threshold; and obtaining a determination result that the out-of-band interference is less than the target signal, in a case that a difference between the LNA output power and the VGA output power is not greater than the preset threshold.

It should be noted that although the above implementations are taken as examples to introduce the apparatus for adjusting the level of the LNA as above, those skilled in the art can understand that the present disclosure should not be limited thereto. In fact, a user can flexibly set each implementation according to personal preferences and/or actual application scenario, as long as each implementation conforms to the technical solutions of the present disclosure.

As such, in the implementations of the present disclosure, by measuring a total average power and a PAPR value of both a target signal and interference of a received signal, and adjusting a level in combination with a maximum-linear-input-power point of a LNA, a total power peak value of the received signal is just less than and closest to the maximum-linear-input-power point when the received signal enters the LNA, such that a SNR is optimized, and the intelligent adjustment of the LNA in a burst broadband communication system is realized.

Figure 5:
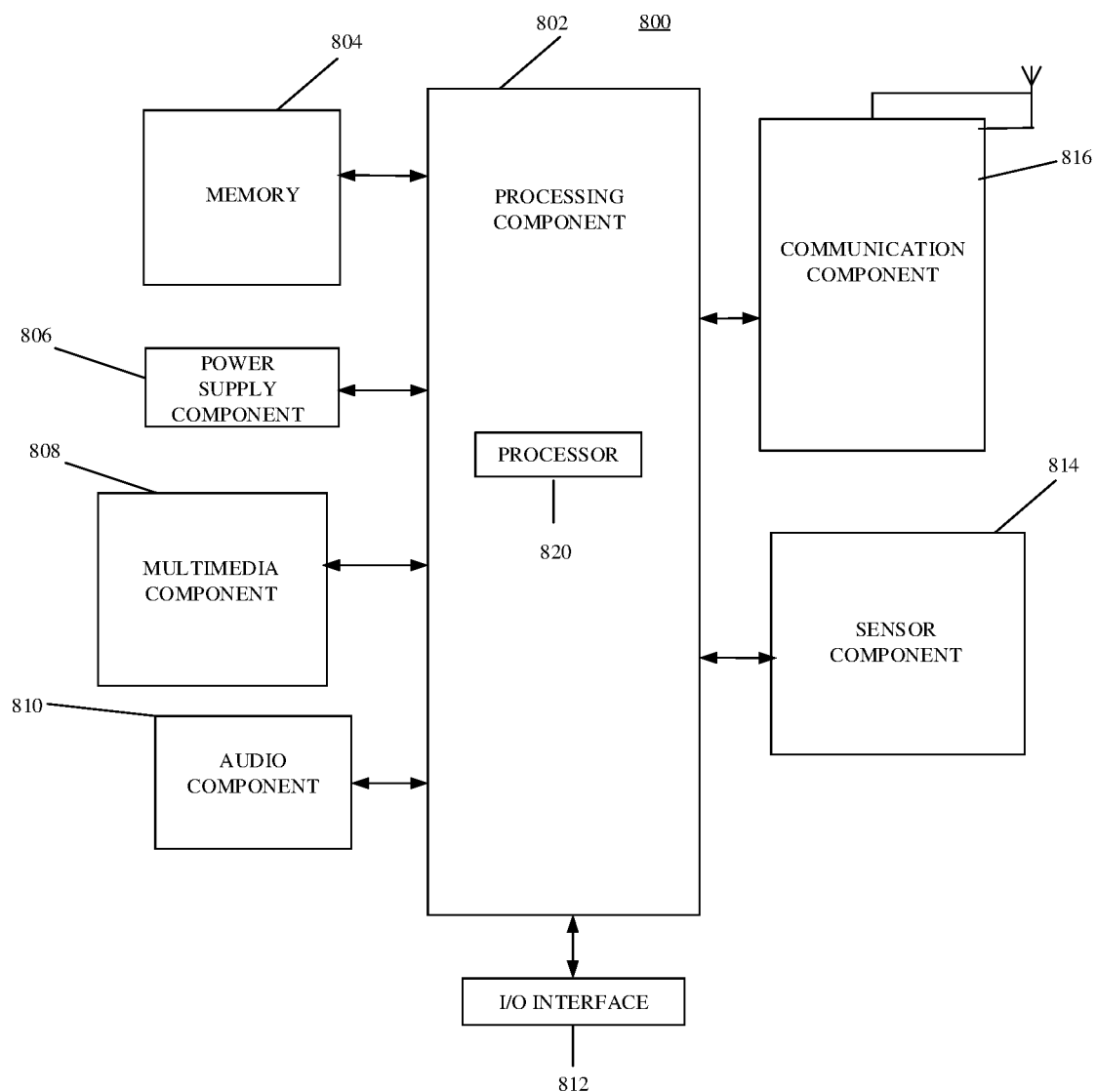
FIG. 5 is a block diagram of a terminal device for adjusting a level of a LNA according to an implementation of the present disclosure.

FIG. 5 is a block diagram of a terminal device 800 for adjusting a level of a LNA according to an implementation of the present disclosure. For example, the terminal device 800 may be a mobile phone, a computer, a digital broadcast terminal, a messaging device, a gaming console, a tablet device, a medical device, an exercise equipment, a personal digital assistant, etc.

Reference can be made to FIG. 5, the terminal device 800 may include one or more of the following components: a processing component 802, a memory 804, a power supply component 806, a multimedia component 808, an audio component 810, an input/output (I/O) interface 812, a sensor component 814, and a communication component 816.

The processing component 802 typically controls the overall operation of the terminal device 800, such as operations associated with display, telephone call, data communication, camera operation, and recording operation. The processing component 802 may include one or more processors 820 to execute instructions to complete all or part of the steps of the above method. In addition, the processing component 802 may include one or more modules to facilitate interaction between the processing component 802 and other components. For example, the processing component 802 may include a multimedia module to facilitate interaction between the multimedia component 808 and the processing component 802.

The memory 804 is configured to store various types of data to support operations in the terminal device 800. Examples of these data include instructions for any application or method operated on the terminal device 800, contact data, phonebook data, messages, pictures, videos, and the like. The memory 804 may be implemented by any type of transitory or non-transitory storage device or a combination thereof, such as static random access memory (SRAM), electrically erasable programmable read only memory (EEPROM), erasable programmable read only memory (EPROM), programmable read only memory (PROM), read only memory (ROM), magnetic memory, flash memory, magnetic disk, or optical disk.

The power supply assembly 806 provides power to various components of the terminal device 800. The power component 806 may include a power management system, one or more power supplies, and other components associated with generating, managing, and allocating power for the terminal device 800.

The multimedia component 808 includes a screen providing an output interface between the terminal device 800 and a user. In some implementations, the screen may include a liquid crystal display (LCD) and a touch panel (TP). If the screen includes a touch panel, the screen may be implemented as a touch screen to receive an input signal from the user. The touch panel includes one or more touch sensors to sense touch, sliding and gestures on the touch panel. The touch sensor can not only sense the boundary of the touch or slide operation, but also detect the duration and pressure related to the touch or slide operation. In some implementations, the multimedia component 808 includes a front camera and/or a rear camera. When the terminal device 800 is in an operation mode, such as shooting mode or video mode, the front camera and/or rear camera can receive external multimedia data. Each front camera and rear camera can be a fixed optical lens system or have focal length and optical zoom capability.

The audio component 810 is configured to output and/or input audio signals. For example, the audio component 810 includes a microphone (MIC) configured to receive an external audio signal when the terminal device 800 is in an operation mode, such as a call mode, a recording mode, and a speech recognition mode. The received audio signal may be further stored in the memory 804 or transmitted via the communication component 816. In some implementations, the audio component 810 also includes a speaker for outputting an audio signal.

The I/O interface 812 provides an interface between the processing component 802 and a peripheral interface module. The peripheral interface module can be a keyboard, click wheel, button, etc. These buttons may include but are not limited to: home button, volume button, start button, and lock button.

The sensor assembly 814 includes one or more sensors for providing state evaluation on various aspects for the terminal device 800. For example, the sensor assembly 814 may detect an on/off state of the terminal device 800 and the relative positioning of the components. For example, the components are the display and keypad of the terminal device 800. The sensor component 814 can also detect position change of the terminal device 800 or one component of the terminal device 800, presence or absence of user contact with the terminal device 800, orientation or acceleration/deceleration of the terminal device 800, and temperature change of the terminal device 800. The sensor assembly 814 may include a proximity sensor configured to detect presence of nearby objects without any physical contact. The sensor assembly 814 may further include an optical sensor, such as a complementary metal oxide semi-conductor (CMOS) or charge-coupled device (CCD) image sensor, for use in imaging applications. In some implementations, the sensor assembly 814 may also include an acceleration sensor, a gyroscope sensor, a magnetic sensor, a pressure sensor, or a temperature sensor.

The communication component 816 is configured to facilitate wired or wireless communication between the terminal device 800 and other devices. The terminal device 800 may access a wireless network based on a communication standard, such as wireless fidelity (WiFi), the 2nd generation (2G) or the 3rd generation (3G), or a combination thereof. In an exemplary implementation, the communication component 816 receives a broadcast signal or broadcast related information from an external broadcast management system via a broadcast channel. In an exemplary implementation, the communication component 816 also includes a near-field communication (NFC) module to facilitate short-range communication. For example, the NFC module can be implemented based on radio frequency identification (RFID) technology, infrared data association (IrDA) technology, ultra wideband (UWB) technology, Bluetooth (BT) technology, and other technologies.

In an exemplary implementation, the terminal device 800 may be implemented by one or more application specific integrated circuits (ASIC), digital signal processors (DSPS), digital signal processing devices (DSPD), programmable logic devices (PLD), field programmable gate arrays (FPGA), controllers, microcontrollers, microprocessors, or other electronic components for performing the above methods.

In an exemplary implementation, a non-transitory computer readable storage medium is further provided, for example, a memory 804 storing computer program instructions. The computer program instructions are operable with a processor 820 of the terminal device 800 to perform the above methods.

Figure 6:
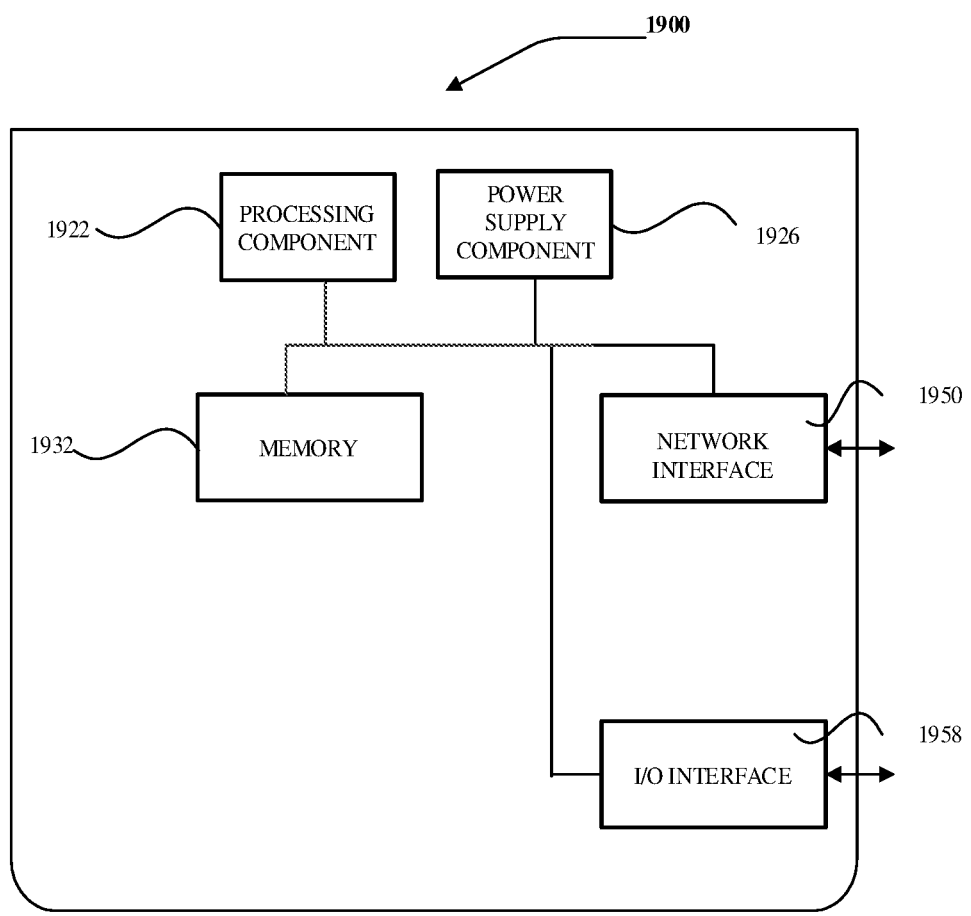
FIG. 6 is a block diagram of a network-element device for adjusting a level of a LNA according to an implementation of the present disclosure.

FIG. 6 is a block diagram of a network-element device 1900 for adjusting a level of a LNA according to an implementation of the present disclosure. For example, the network-element device 1900 can be provided as a server. Referring to FIG. 9, the network-element device 1900 includes a processing component 1922, which further includes one or more processors as well as memory resources represented by a memory 1932 and configured to store instructions (such as applications) executable with the processing component 1922. The application stored in the memory 1932 may include one or more modules, each corresponding to a set of instructions. In addition, the applications stored in the processing component 1922 is configured to carry out instructions to perform the above methods.

The network-element device 1900 may further include a power supply component 1926 configured to perform power management of the network-element device 1900, a wired or wireless network interface 1950 configured to connect the network-element device 1900 to the network, and an I/O interface 1958. The network-element device 1900 may operate an operating system stored in the memory 1932, such as Windows Server™, Mac OS X™, Unix™, Linux™, Free-BSD™, etc.

In an exemplary implementation, a non-transitory computer readable storage medium is provided, such as the memory 1932 storing computer program instructions. The computer program instructions can be carried out by the processing component 1922 of the network-element device 1900 to perform the above methods.

This disclosure can be a system, a method, and/or a computer program product. The computer program product includes a computer readable storage medium, which carries computer readable program instructions for a processor to implement various aspects of the disclosure.

The computer-readable storage medium may be a tangible device that can hold and store instructions used by an instruction execution device. The computer-readable storage medium may be, for example, but is not limited to, an electrical storage device, a magnetic storage device, an optical storage device, an electromagnetic storage device, a semiconductor storage device, or any suitable combination of the above. More specific examples (non-exhaustive list) of a computer-readable storage medium include: portable computer disk, hard disk, random access memory (RAM), read only memory (ROM), erasable programmable ROM (EPROM or flash memory), static RAM (SRAM), portable compact disk ROM (CD-ROM), digital multifunction disk (DVD), a memory stick, a floppy disk, a mechanical encoding device, such as a punch card or a convex structure in a groove on which instructions are stored, and any suitable combination of the above. The computer-readable storage medium used herein is not interpreted as an instantaneous signal itself, such as a radio wave or other freely propagating electromagnetic wave, an electromagnetic wave propagating through a waveguide or other transmission medium (for example, an optical pulse through an optical fiber cable), or an electrical signal transmitted through a wire.

The computer-readable program instructions described herein may be downloaded from a computer-readable storage medium to various computing/processing devices, or to an external computer or external storage device through a network, such as the Internet, a local area network (LAN), a wide area network (WAN), and/or a wireless network. The network may include copper transmission cables, optical fiber transmission, wireless transmission, routers, firewalls, switches, gateway computers, and/or edge servers. The network adapter card or network interface in each computing/processing device receives computer-readable program instructions from the network and forwards the computer-readable program instructions to be stored in the computer-readable storage medium in each computing/processing device.

The computer program instructions for performing the operations of the disclosure may be assembly instructions, instruction set architecture (ISA) instructions, machine instructions, machine related instructions, microcode, firmware instructions, status setting data, or source code or object code written in any combination of one or more programming languages. The programming languages include object-oriented programming languages such as Smalltalk, C++, etc., and conventional procedural programming languages such as "C" language or similar programming languages. Computer readable program instructions may be executed completely on a user's computer, partially on the user's computer, as a separate software package, partially on the user's computer and partially on a remote computer, or completely on the remote computer or server. In the case of the remote computer, the remote computer may be connected to the user computer through any kind of network, including a LAN or a WAN, or may be connected to an external computer (for example, connected through an Internet via an Internet service provider). In some implementations, an electronic circuit such as a programmable logic circuit, a field programmable gate array (FPGA), or a programmable logic array (PLA) can be personalized by utilizing the state information of computer-readable program instructions. The electronic circuit can carry out computer readable program instructions, so as to implement various aspects of the disclosure.

Various aspects of the disclosure are described herein with reference to flowcharts and/or block diagrams of methods, devices (systems) and computer program products according to implementations of the disclosure. It should be understood that each block of a flowchart and/or block diagram and a combination of blocks in the flowchart and/or block diagram may be implemented by computer-readable program instructions.

These computer-readable program instructions can be provided to a processor of a general-purpose computer, a special-purpose computer, or other programmable data processing devices, so as to produce a machine so that when these instructions are executed by a processor of a computer or other programmable data processing devices, a device is generated to realize the functions/actions specified in one or more blocks in the flowchart and/or block diagram. These computer-readable program instructions may also be stored in a computer-readable storage medium, to cause computers, programmable data processing devices, and/or other devices to operate in a specific manner, so that the computer-readable medium in which the instructions are stored includes a manufacture which includes instructions to implement various aspects of the functions/actions specified in one or more blocks in the flowchart and/or block diagram.

Computer readable program instructions may also be loaded onto a computer, other programmable data processing devices, or other devices, so that a series of operation steps are performed on the computer, other programmable data processing device, or other devices to generate a computer implemented process, so that instructions executed in the computer, other programmable data processing device, or other devices can realize the functions/actions specified in one or more blocks in the flowchart and/or block diagram.

The flowchart and block diagram in the accompanying drawings show the architecture, functions and operations of possible implementations of systems, methods and computer program products according to various implementations of the disclosure. In this regard, each block in the flowchart or block diagram may represent a part of a module, program segment, or instruction containing one or more executable instructions for realizing a specified logical function. In some alternative implementations, the functions marked in the blocks may also occur in a different order than those marked in the drawings. For example, two consecutive blocks can actually be executed basically in parallel, and they sometimes can be executed in the opposite order, depending on the function involved. It should also be noted that each block in the block diagram and/or flowchart and the combination of blocks in the block diagram and/or flowchart can be realized by a dedicated hardware based system performing specified functions or actions, or by a combination of dedicated hardware and computer instructions.

Various implementations of the present disclosure have been described above, and the above description is exemplary rather than exhaustive, and is not limited to the various implementations disclosed. Without departing from the scope and spirit of the various implementations described, many modifications and changes are obvious to those skilled in the art. The terms used herein are selected to best explain the principle, practical application, or improvement of the technology in the market of each implementation, or to enable other ordinary skilled person in the art to understand the various implementations disclosed herein.

What is claimed is:

1. An apparatus for adjusting a level of a low-noise amplifier (LNA), comprising:
   the LNA configured to amplify a received signal to obtain a first signal, wherein the received signal comprises out-of-band interference and a target signal;
   a peak-to-average power ratio (PAPR) module configured to measure a PAPR value of the first signal and a strength of the first signal; and
   an automatic gain control (AGC) module configured to
      obtain a maximum power value of the received signal according to the strength of the first signal and the PAPR value;
      select a maximum-linear-input-power point of the LNA according to the maximum power value; and
      determine a corresponding gain level of the LNA according to the maximum-linear-input-power point.

2. The apparatus of claim 1, wherein the LNA comprises a plurality of maximum-linear-input-power points; and
   the AGC module is further configured to select a maximum-linear-input-power point with a minimum value, in a case that the maximum power value is not greater than the plurality of maximum-linear-input-power points.

3. The apparatus of claim 1, further comprising:
   a first analog-to-digital converter (ADC) configured to perform analog-to-digital conversion on the first signal output by the LNA and input a converted first digital signal to the PAPR module.

4. The apparatus of claim 1, further comprising:
   a frequency mixer configured to perform frequency mixing on the first signal and a local oscillator signal to obtain a baseband signal;
   a frequency-selective filter configured to suppress out-of-band interference in the baseband signal;
   a variable gain amplifier (VGA) configured to amplify a baseband signal in which the out-of-band interference is suppressed, to obtain a second signal; and
   a second ADC configured to perform analog-to-digital conversion on the second signal and input a converted second digital signal to the AGC module.

5. The apparatus of claim 4, wherein the AGC module is further configured to
   compare the out-of-band interference with the target signal to obtain a determination result; and
   modify the PAPR value according to the determination result.

6. The apparatus of claim 5, wherein the AGC module is further configured to
   obtain the PAPR value according to a statistic of the PAPR value, in a case that the out-of-band interference is less than the target signal; and
   add the measured PAPR value to a preset increment to obtain the PAPR value, in a case that the out-of-band interference is greater than the target signal.

7. The apparatus of claim 5, wherein the AGC module is further configured to
   compare the out-of-band interference with the target signal according to a LNA output power and a VGA output power;
   obtain a determination result that the out-of-band interference is greater than the target signal, in a case that a difference between the LNA output power and the VGA output power is greater than a preset threshold; and
   obtain a determination result that the out-of-band interference is less than the target signal, in a case that a difference between the LNA output power and the VGA output power is not greater than the preset threshold.

8. A method for adjusting a level of a low-noise amplifier (LNA), applicable to an apparatus for adjusting the level of the LNA and comprising:
amplifying a received signal to obtain a first signal, wherein the received signal comprises out-of-band interference and a target signal;
measuring a peak-to-average power ratio (PAPR) value of the first signal and a strength of the first signal;
obtaining a maximum power value of the received signal according to the strength of the first signal and the PAPR value;
selecting a maximum-linear-input-power point of the LNA according to the maximum power value; and
determining a corresponding gain level of the LNA according to the maximum-linear-input-power point.

9. The method of claim 8, wherein the LNA comprises a plurality of maximum-linear-input-power points; and
selecting the maximum-linear-input-power point of the LNA according to the maximum power value comprises:
selecting a maximum-linear-input-power point with a minimum value, in a case that the maximum power value is not greater than the plurality of maximum-linear-input-power points.

10. The method of claim 8, further comprising:
performing analog-to-digital conversion on the first signal output by the LNA to obtain a first digital signal.

11. The method of claim 8, further comprising:
performing frequency mixing on the first signal and a local oscillator signal to obtain a baseband signal;
suppressing out-of-band interference in the baseband signal;
amplifying a baseband signal in which the out-of-band interference is suppressed, to obtain a second signal; and
performing analog-to-digital conversion on the second signal to obtain a second digital signal.

12. The method of any of claim 11, further comprising:
comparing the out-of-band interference with the target signal to obtain a determination result; and
modifying the PAPR value according to the determination result.

13. The method of claim 12, wherein modifying the PAPR value according to the determination result comprises:
obtaining the PAPR value according to a statistic of the PAPR value, in a case that the out-of-band interference is less than the target signal; and
adding the measured PAPR value to a preset increment to obtain the PAPR value, in a case that the out-of-band interference is greater than the target signal.

14. The method of claim 12, wherein comparing the out-of-band interference with the target signal to obtain the determination result comprises:
comparing the out-of-band interference with the target signal according to a LNA output power and a variable gain amplifier (VGA) output power;
obtaining a determination result that the out-of-band interference is greater than the target signal, in a case that a difference between the LNA output power and the VGA output power is greater than a preset threshold; and
obtaining a determination result that the out-of-band interference is less than the target signal, in a case that a difference between the LNA output power and the VGA output power is not greater than the preset threshold.

15. A terminal device comprising a processor and a memory configured to store instructions executable by the processor, wherein when executing the executable instructions stored in the memory, the processor is configured to:
amplify a received signal to obtain a first signal, wherein the received signal comprises out-of-band interference and a target signal;
measure a peak-to-average power ratio (PAPR) value of the first signal and a strength of the first signal;
obtain a maximum power value of the received signal according to the strength of the first signal and the PAPR value;
select a maximum-linear-input-power point of the LNA according to the maximum power value; and
determine a corresponding gain level of the LNA according to the maximum-linear-input-power point.

16. The terminal device method of claim 15, wherein the LNA comprises a plurality of maximum-linear-input-power points; and
in terms of selecting the maximum-linear-input-power point of the LNA according to the maximum power value, the processor is configured to:
select a maximum-linear-input-power point with a minimum value, in a case that the maximum power value is not greater than the plurality of maximum-linear-input-power points.

17. The terminal device of claim 15, wherein the processor is further configured to:
perform analog-to-digital conversion on the first signal output by the LNA to obtain a first digital signal.

* * * * *